United States Patent
Hebrank et al.

(10) Patent No.: US 8,054,079 B2
(45) Date of Patent: *Nov. 8, 2011

(54) METHOD FOR PROCESSING A DISTORTION-CORRECTED 2D OR 3D RECONSTRUCTION IMAGE RECORDED BY A MAGNETIC RESONANCE DEVICE

(75) Inventors: Franz Hebrank, Herzogenaurach (DE); Thorsten Speckner, Marloffstein (DE); Axel vom Endt, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/801,801

(22) Filed: Jun. 25, 2010

(65) Prior Publication Data

US 2010/0266186 A1    Oct. 21, 2010

Related U.S. Application Data

(62) Division of application No. 11/989,243, filed on Jan. 23, 2008, now Pat. No. 7,772,843.

(30) Foreign Application Priority Data

Jul. 25, 2005 (DE) .................. 10 2005 034 648

(51) Int. Cl.
 *G01V 3/00* (2006.01)
(52) U.S. Cl. ...................... 324/309; 324/307
(58) Field of Classification Search .......... 324/309, 324/307
See application file for complete search history.

(56) References Cited

U.S. PATENT DOCUMENTS

| | | | |
|---|---|---|---|
| 5,099,208 A | 3/1992 | Chang | |
| 5,886,524 A | 3/1999 | Krieg | |
| 6,377,043 B1 | 4/2002 | Aldefeld et al. | |
| 6,501,273 B2 | 12/2002 | Krieg et al. | |
| 6,636,756 B2 | 10/2003 | Zhu | |
| 6,882,151 B2 | 4/2005 | Kiefer et al. | |
| 6,967,479 B2 * | 11/2005 | Polzin et al. | 324/318 |
| 7,088,099 B2 * | 8/2006 | Doddrell et al. | 324/309 |
| 7,202,662 B2 * | 4/2007 | Markl et al. | 324/306 |
| 7,772,843 B2 * | 8/2010 | Hebrank et al. | 324/309 |

(Continued)

FOREIGN PATENT DOCUMENTS

DE    19540837 A1    5/1997

(Continued)

OTHER PUBLICATIONS

Janke, Andrew et al., "Use of Spherical Harmonic Deconvolution Methods to Compensate for Nonlinear Gradient Effects on MRI Images", Magnetic Resource in Medicine 52, 2004, pp. 115-122.

(Continued)

*Primary Examiner* — Louis Arana
(74) *Attorney, Agent, or Firm* — Harness, Dickey & Pierce, P.L.C.

(57) ABSTRACT

In one embodiment a method for processing a reconstruction image is disclosed. The method includes recording the reconstruction image by a magnetic resonance device having a gradient coil to generate a gradient field. The method further includes distortion-correcting the reconstruction image. The method further includes back-transforming the distortion-corrected reconstruction image, by an image processing device, into a distortion-uncorrected reconstruction image, the back-transforming uses an algorithm having a first input value describing a real gradient field given at a real measuring point of the signal.

4 Claims, 1 Drawing Sheet

U.S. PATENT DOCUMENTS

2005/0024051 A1    2/2005    Doddrell

FOREIGN PATENT DOCUMENTS

DE    19753093 A1    6/1999
DE    10028560 A1    12/2001
DE    10252852 A1    6/2004

OTHER PUBLICATIONS

Morgan et al.; "Correction of spatial distortion in EPI due to inhomogeneous static magnetic field using the reversed gradient method"; J. Magn. Reson. Imaging 19 82994), S. 499-507; Others; 2004.

Janke; "a complete distortion correction for MR images: I. Gradient warp correction"; Magn. Reson. Med. 52 (2004), S. 115-122; Others; 2004.

Doran S.J.; A complete distortion correction for MR images; Phys. Med. Biol. 50 (2005), S. 1343-1361 (Epub Mar. 16, 2005); Others; 2005.

Kawanaka et al; Estimation of Static Magnetic Field and Gradient Fields From NMR Image Journal fof Physics Scientific Instruments, Bd. 19, Nr. 10, Oct. 1, 1986, Seiten 871-875, XP020017700 ISSN: 0022-3735; Magazine.

Langlois S. et al.; MIR Geometric Distortion: A Simple Approach to Correcting the Effects of Non-Linear Gradient Fields JMRI 9: 821-831, 1999; Magazine.

* cited by examiner

METHOD FOR PROCESSING A DISTORTION-CORRECTED 2D OR 3D RECONSTRUCTION IMAGE RECORDED BY A MAGNETIC RESONANCE DEVICE

PRIORITY STATEMENT

This application is a divisional of U.S. application Ser. No. 11/989,243, filed Jan. 23, 2008, which is a National Phase of PCT Patent Application No PCT/EP2006/064212 which has an International filing date of Jul. 13, 2006, which designated the United States of America and which claims priority on German Patent Application DE 10 2005 034 648.0 filed Jul. 25, 2005, the entire contents of which are hereby incorporated herein by reference in their entirety.

FIELD

At least one embodiment of the invention relates to a method for processing a 2D or 3D reconstruction image that is recorded by a magnetic resonance device. For example, it may relate to one comprising a gradient coil that generates a gradient field, and is distortion-corrected with regard to a given nonlinearity-leading to an image distortion-of the gradient field by using an algorithm that processes the measurement signals at various measuring points lying in the imaging volume, which algorithm processes, with respect to each signal processed by it, a first input value describing the real gradient field given at the real measuring point of the signal.

BACKGROUND

A magnetic resonance device serves for recording or generating images of an examination object that are acquired by the signals resulting from a radio frequency excitation and in which the image is subsequently determined or reconstructed. To this end, a basic field magnet is used to generate a basic field that is as homogeneous as possible and has a homogeneity volume of defined homogeneity. Superposed on the field for imaging purposes is a gradient field generated by way of a gradient coil and having field components in the x-, y- and z-directions. Finally, a radio frequency coil produces an RF pulse for the spin excitation that leads to the signal generation. The design and mode of operation of a magnetic resonance device are adequately known to the person skilled in the art and require no further explanation.

The recording of a magnetic resonance image or a tomogram is preferably performed at the center of the approximately spherical homogeneity volume, the so-called isocenter. In the context of a so-called "isocentering" concept recently introduced, the slice set to be measured is positioned at the isocenter by automatic table displacement for each protocol used for a measurement, that is to say a signal recording for imaging. That is to say, for each slice to be recorded the patient is readjusted as necessary such that the body region in which the slice lies is positioned at the isocenter. This ensures the best possible basic field homogeneity and gradient linearity, and thus image quality, for the volume to be imaged.

In order to avoid systematic errors during the slice planning, that is to say the definition of the slices to be recorded, the slice planning may be done in the context of the isocentering concept exclusively on distortion-corrected images. Such images are corrected by geometric distortions that result from gradient nonlinearities. When constructing a magnetic resonance image using one or more algorithms starting from the recorded measurement signals, it is firstly assumed that there is an ideal linear gradient field.

However, real gradient fields deviate from this idealized linear profile and have nonlinear components. This additional nonlinearity has the consequence that a signal measured at a first real location falsely appears at a second, other location after the reconstruction. Via the so-called distortion correction, these errors are corrected on the basis of knowledge of the spatial nonlinearity of the gradient fields with the aid of the algorithm or algorithms used, which have corresponding correction sections. Since these distortion-corrected images consequently exhibit images that are geometrically or anatomically correct, the aim is to apply the distortion correction to all measured images.

Since specific applications such as, for example, spectroscopy, necessarily dictate the use of undistorted images in order to ensure an absolute positioning accuracy of protocol planning and of imaging evaluation, it is not the processed, distortion-corrected images or data records that are filed, but the originally measured data records that exhibit the distortions owing to the nonlinearities. Storing both the originally recorded image data records, that is to say the distorted 2D or 3D reconstruction images, as well as the distortion-corrected reconstruction images in the image database is not an option, since this doubles the image data volume to be stored.

Consequently, evaluating images in the context of slice planning, which in by far most cases is performed with the aid of the distortion-corrected images, always requires these images to be recalculated from the original measured data. Thus, in a normal operation there is consequently a need for considerable and time consuming computer performance resulting from the requirement that the undistorted image data be on hand for a few applications.

SUMMARY

At least one embodiment of the invention involves a problem of specifying a method that is improved by comparison.

Provided for the purpose of a solution is a 2D or 3D reconstruction image processing method in which method the distortion-corrected reconstruction image is back transformed into a distortion-uncorrected reconstruction image by using the first algorithm or a second algorithm corresponding thereto and to which there is given as second input value in relation to each signal processed by it one such as describes a fictitious gradient field at the respective distorted measuring point at which the processed signal appears, and is raised or lowered by the nonlinear field component of the real gradient field compared with the linear ideal gradient field.

At least one embodiment of the invention involves an idea of an inverse distortion correction in the context of which use is made of the algorithm, or of an algorithm normally used for distortion correction but which is given only another input value that describes the gradient field. This input value describes a "fictitious" or "effective" gradient field that describes the back transformation, and thus consequently images the nonlinear field component, as considered in the context of the distortion correction, with back transformation or inversely. A transformation, induced by distortion correction, of the actually recorded measurement signal from the distortion-induced measuring point to the real measuring point is thereby cancelled or inverted, that is to say the signals of the distortion-corrected image, which appear at the real measuring points as a consequence of the correction, are imaged back to the distortion-induced "wrong" measuring point.

The inventive method of at least one embodiment thus permits exclusively the distortion-corrected 2D or 3D image data records or reconstruction images to be filed in the image data memory. These are generally used during operation. However, should it be necessary for the purpose of slice planning etc. to have to make recourse to an original image, it is possible when applying the inventive method to invert the distortion correction in a simple way and to use the distortion-corrected reconstruction image to determine the originally recorded distortion-uncorrected reconstruction image. In at least one embodiment, it is preferred to this end to use the same algorithm that was used for the distortion correction, all that is required is to determine and provide another input value in order to undertake the inverse correction, and so the inventive back transformation can also be performed very easily.

As set forth above, the central "element" of the inverse correction method is the respective input value specific to pixel or measuring point. In the context both of the distortion correction and of the back transformation, for performance reasons it is not usual to process all pixels or signals at all measuring points. However, only a set of signals or measuring points between which interpolation is then carried out. If very high image qualities are desired, however, it is also possible to process every pixel or every signal.

In at least one embodiment, it is preferred to undertake the following steps in order to determine the pixel-specific second input value:

determination of the respective nonlinear field component at each real measuring point of a processed signal of the distortion-corrected 2D or 3D reconstruction image in each of the two or three spatial directions, determination of the geometrical distortion in the three spatial directions, and determination of the position of the respective distorted measuring points, and determination of the second input value with the aid of the respective nonlinear field component and of the field component of the linear ideal gradient field at the distorted measuring point.

In the context of the first method step, there is determined in relation to each measuring point in the distortion-corrected 2D or 3D reconstruction image by comparison with the ideal linear gradient field that nonlinear field component which is given at this point between the real gradient field, which is generated at this point, and the ideal gradient field. Subsequently, the value of the real, nonlinear gradient field at the real, distortion-corrected measuring point is used to determine the corresponding magnetic field value on the linear gradient field curve and the associated distorted measuring point, that is to say the distortion is determined in each of the three spatial directions for each measuring point in the distortion-corrected image. Subsequently the second input value is determined, which results from the value of the field component of the linear ideal gradient field at the distorted measuring point (which corresponds to the value of the real field component at the actual measuring point) and from the nonlinear field component. This "effective gradient field value" at the respective distorted measuring point is subsequently used as a basis for the back transformation, and applied to the signal at the respective associated real, distortion-corrected measuring point. This mode of procedure is undertaken with reference to all two or three spatial directions. The determination of this "effective" or "fictitious" gradient field value or gradient field from the known real, nonlinear gradient field and the ideal, linear gradient field is extremely simple and can be performed very quickly.

In at least one embodiment, it is preferred to use as first or as second algorithm of one such as is given development coefficients of a multipole development of the gradient field, the development coefficients being determined with the aid of the second input values. A known way of correcting distortion is the so-called multipole development of the gradient field, which is a spherical function development in which the field is represented as the sum of various terms. In the context of this development, use is made of development coefficients a and b that describe the respective nonlinearity at the respective point being considered. These development coefficients can be determined by using such a distortion correction algorithm with the aid of the fictitious or effective gradient field as previously described. The person skilled in the art is sufficiently well aware of the multipole development or the distortion correction with the use of development coefficients of a multipole development, and so there is no need to go into this in more detail.

In addition to the method itself, at least one embodiment of the invention further relates to a magnetic resonance device comprising an image processing device for processing measured signals and for image reconstruction, designed for carrying out the above-described method.

BRIEF DESCRIPTION OF THE DRAWINGS

Further advantages, features and details of the invention emerge from the example embodiment described below, as well as with the aid of the drawings, in which.

DETAILED DESCRIPTION OF THE EXAMPLE EMBODIMENTS

Figure 1:
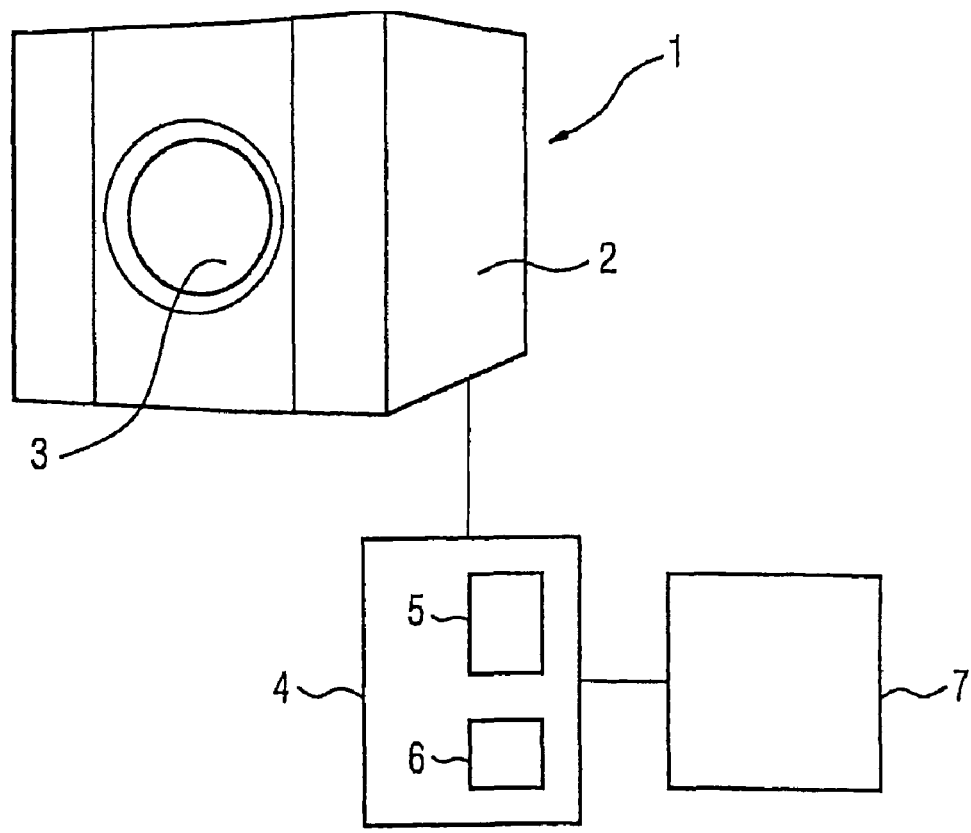
FIG. 1 shows a schematic illustration of a magnetic resonance device.

FIG. 1 shows an inventive magnetic resonance device 1 including the signal recording section 2, which includes the basic field magnet (not shown in more detail), a gradient coil 3 and a radio frequency coil (not shown in more detail) as well as the conventional further components, for which there is no need to give more detail. The magnet generates in the known manner a basic field with a homogeneity volume that is homogenized by using suitable shim devices such as, for example, iron shim plates or shim coils. These shim devices are likewise not illustrated in more detail, since they are sufficiently well known to the person skilled in the art. The gradient coil 3 is used to generate in a known way a gradient field that has three field components pointing in the respective spatial directions x, y, z and really exhibits a certain nonlinearity.

Further shown is a control device 4 that controls the general operation of the system and thus also the image recording, and exhibits an image processing device 5 and an assigned image data memory 6 as well as an assigned monitor 7 for displaying the 3D reconstruction images generated via the image processing device 5. The imaging signals, which are received via the suitable signal recording devices or antennas in the recording section 2 and are processed in the image processing device 5 are given to the control device 4. The image processing device 5 is designed for the 3D reconstruction and for correcting the image distortion resulting from the nonlinearities of the gradient field. At least one or, if appropriate, a number of reconstruction or correction algorithms are stored to this end. A person skilled in the art is sufficiently well aware of different reconstruction or correction algorithms.

In the case of the inventive magnetic resonance device of an embodiment of the present application, the image data memory 6 stores the distortion-corrected image data records or reconstruction images, but not the image data records or signal sets really recorded. If, instead of a distortion-corrected image, it is now necessary to output on the monitor 7 an originally recorded uncorrected image, the image processing device 5 is used to access the respective image data record in the image data memory 6 and undertake a back transformation of the image data, that is to say image data are determined as they were originally recorded. The 2D or 3D reconstruction image is then determined therewith.

Descriptions are given below of, on the one hand, the principle of the distortion correction and, on the other hand, the inventive principle of the inverse distortion correction for enabling the inventive back transformation.

Magnetic resonance imaging is based on the time-dependent measurement of the magnetic resonance signals in conjunction with the application of a magnetic field gradient. When the reconstructing images are using the measured signals, it is assumed that these gradients exhibit exclusively linear terms. The corresponding relationships are explained below by way of example for the x-axis, in order to simplify the illustration. Of course, corresponding statements are also valid with reference to the y- and z-axes.

The ideal magnetic field $B_i(x)$ is given as a function of the point x by $$B_i(x) = G \cdot x,$$

G being a constant value specifying the gradient strength.

However, real gradient fields with finitely extended coil geometries also exhibit nonlinearities that lead to spatial distortion of the reconstructed images.

This deviation of the real fields $B_r(x)$ from the idealized profile can be represented as follows:

$$B_r(x) = B_i(x) + \Delta B_r(x) = G \cdot x + \Delta B_r(x),$$

$\Delta B_r(x)$ describing the nonlinear field component, (here in the x-direction). The consequence of this additional nonlinear field component is that a measured signal from the point $x_t$, that is to say the real measuring point, appears falsely at the point $x_m$ after the reconstruction. The following then applies for the true point $x_t$:

$$x_t = x_m + \frac{\Delta B_r(x_t)}{G}$$

Existing algorithms for distortion correction are based on the knowledge of this spatial nonlinearity $\Delta B_r(x)$ of the gradient fields. This nonlinearity is a system property and is typically parameterized as a coefficient of a multipole development.

The inventive method of at least one embodiment now offers a simple possibility for the back transformation of the distortion-corrected images into the associated distortion-uncorrected image by using existing methods or algorithms of the "normal" distortion correction. The sole difference is the use of a so-called "effective" or "fictitious" gradient field that describes the back transformation. This gradient field $B_e(x)$ can be described as $$B_e(x) = G \cdot x - \Delta B_e(x),$$

$\Delta B_e(x)$ being a nonlinear component of the "effective" gradient field. Consequently, in complete analogy with the above equation, this "effective" gradient field must calculate $x_m$ in accordance with $$x_m = x_t + \frac{\Delta B_e(x_m)}{G},$$

the nonlinear component of the effective gradient field being determined in accordance with $$\Delta B_e(x_m) = \Delta B_r(x_t).$$

Figure 2:
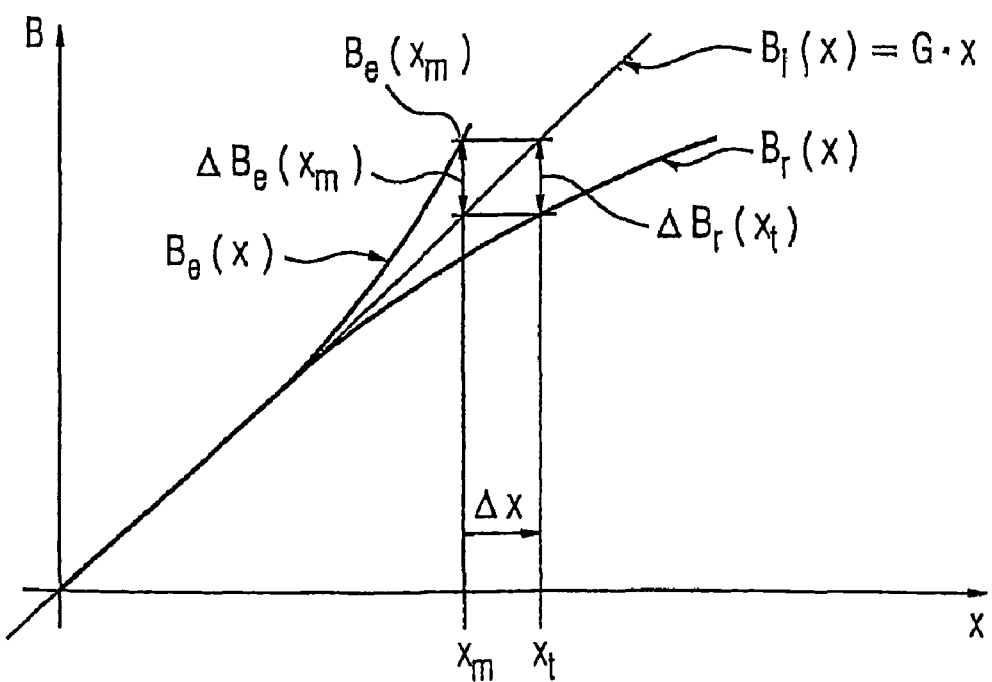
FIG. 2 shows a diagram illustrating the determination of the fictitious or effective gradient field.

These relationships emerge clearly from FIG. 2, where the point x is plotted along the abscissa, and the field strength B of the gradient field is plotted along the ordinate. Shown firstly is the dashed line which describes the ideal linear gradient field $B_i(x) = G \cdot x$. Further shown, via the curve $B_r(x)$, is the real gradient field profile, and also an example of the "effective" gradient field $B_e(x)$.

The first step in calculating the "effective" gradient field at a point that is to be back transformed in the context of the inverse distortion correction is to determine at the real, distortion-corrected measuring point $x_t$ the nonlinear field component $\Delta B_r(x_t)$ that results from the difference between the ideal gradient field $\Delta B_i(x_t)$ at the point $x_t$ and the real gradient field $B_r(x_t)$. Subsequently, the field value that corresponds to the real gradient field value $B_r(x_t)$ at the point $x_t$ is determined on the ideal gradient field curve $B_i(x)$. As can be seen from FIG. 2, the distorted measuring point $x_m$ results therefrom.

In order to determine the effective gradient field value at the point $x_m$, the value is now determined as $B_e(x_m) = G \cdot x_m - \Delta B_r(x_t)$. That is to say, the gradient field value on the ideal field curve is raised or lowered by this value depending on the sign of the nonlinear field component of the real gradient field at the point $x_t$. The effective nonlinearity $\Delta B_e(x_m)$ thus corresponds to the effective real nonlinearity $\Delta B_r(x_t)$.

Starting by way of example only along the x-axis, this calculation is now carried out for a family of points $x_t^i$, which is to say that the respective distortion $\Delta x^i = \Delta B(x_t^i)/G$ is calculated for this family of points.

Subsequently, the effective gradient field is determined as $B_e(x_m^i) = G \cdot x_m^i - \Delta B_r(x_t^i)$ at the respective point $x_m^i = x_t^i + \Delta x^i$. These magnetic field values at the points $x_m^i$ then serve as input values for the distortion correction method being used, that is to say the correction algorithm being used, by which, for example, the distortion correction has already been performed in the context of the first processing.

If the distortion correction method has to be provided with development coefficients of a multipole development of the field, said development coefficients can, as already described, be determined from the magnetic field values $B_e(x_m^i)$ at the points $x_m^i$.

Finally, it may be pointed out once again that the above-described determination of the effective gradient field in all three spatial directions is carried out for each point of a family of points $x_t^i, y_t^i, z_t^i$ when a 3D reconstruction image is present; of course, only the two relevant spatial directions are considered in the case of a 2D reconstruction image.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for processing a 2D or 3D reconstruction image, the method comprising:
   recording, by a magnetic resonance device, the 2D or 3D reconstruction image, the magnetic resonance device including a gradient coil to generate a gradient field;

distortion-correcting a nonlinearity of the 2D or 3D reconstruction image to generate an image distortion of the gradient field using an algorithm that processes measurement signals at various measuring points lying in an imaging volume, the algorithm including a first input value for each of the measurement signals, the first input value describing a real gradient field given at a real measuring point of the signal; and back-transforming the distortion-corrected reconstruction image into a distortion-uncorrected reconstruction image by using the algorithm.

2. The method as claimed in claim 1, wherein the algorithm is based on development coefficients of a multipole development of the gradient field, the development coefficients being determined using second input values.

3. The method as claimed in claim 2, wherein the second input values are pixel-specific, and the following steps are performed to determine each of the pixel-specific second input values:

determining the respective nonlinear field component at each real measuring point of a processed signal of the distortion-corrected 2D or 3D reconstruction image in each of the two or three spatial directions, determining the geometrical distortion in the two or three spatial directions, determining the position of the respective distorted measuring points, and determining the second input value using the respective nonlinear field component and of the field component of the linear ideal gradient field at the distorted measuring point.

4. A magnetic resonance device, comprising:

an image processing device configured to, distortion-correct a nonlinearity of a recorded 2D or 3D reconstruction image to generate an image distortion of a gradient field using an algorithm that processes measurement signals at various measuring points lying in an imaging volume, the algorithm including a first input value for each of the measurement signals, the first input value describing a real gradient field given at a real measuring point of the signal; and back-transform a distortion-corrected reconstruction image into a distortion-uncorrected reconstruction image using the algorithm.

* * * * *